United States Patent
Miller et al.

(10) Patent No.: US 7,175,677 B2
(45) Date of Patent: Feb. 13, 2007

(54) METHODOLOGY FOR MAKING ELECTRICAL CONTACT FROM A BUTTON CELL BATTERY TO A PRINTED CIRCUIT BOARD AND A PROCESS FOR MANUFACTURING THE SAME

(75) Inventors: Robert P. Miller, Schaumburg, IL (US); David Mossington, Chicago, IL (US); Michael J. Roller, Crystal Lake, IL (US)

(73) Assignee: Omron Corporation, Kyoto (JP)

(*) Notice: Subject to any disclaimer, the term of this patent is extended or adjusted under 35 U.S.C. 154(b) by 607 days.

(21) Appl. No.: 10/109,445

(22) Filed: Mar. 28, 2002

(65) Prior Publication Data

US 2003/0186119 A1    Oct. 2, 2003

(51) Int. Cl.
*H01M 6/00* (2006.01)
*H01M 2/30* (2006.01)
*H01R 3/00* (2006.01)

(52) U.S. Cl. .................. 29/623.1; 429/100; 429/178; 439/500

(58) Field of Classification Search .................. None
See application file for complete search history.

(56) References Cited

U.S. PATENT DOCUMENTS

| | | | |
|---|---|---|---|
| 4,269,908 A | 5/1981 | Stemme | 429/98 |
| 4,535,036 A | 8/1985 | Kelm et al. | 429/99 |
| 4,640,874 A | 2/1987 | Kelm | 429/27 |
| 4,931,369 A | 6/1990 | Hardt et al. | 429/98 |
| 5,188,912 A | 2/1993 | Katoh et al. | 429/96 |
| 5,232,796 A | 8/1993 | Baumgartner | 429/187 |
| 5,244,411 A * | 9/1993 | Schinke et al. | 439/516 |
| 5,589,288 A | 12/1996 | Coulson et al. | 429/96 |
| 5,607,792 A | 3/1997 | Garcia et al. | 429/97 |
| 5,621,618 A | 4/1997 | Komiyama | 361/732 |
| 5,637,417 A | 6/1997 | Engmark et al. | 429/97 |
| 5,660,945 A | 8/1997 | McCormick et al. | 429/123 |
| 5,663,011 A | 9/1997 | Bunyea et al. | 429/97 |
| 5,681,667 A | 10/1997 | Bunyea et al. | 429/97 |
| 5,718,985 A | 2/1998 | Bunyea et al. | 429/97 |
| 5,762,512 A | 6/1998 | Trant et al. | 439/347 |
| 5,851,693 A * | 12/1998 | Sano et al. | 429/174 |
| 5,895,729 A | 4/1999 | Phelps, III et al. | 429/97 |
| 6,042,962 A | 3/2000 | Ling | 429/99 |
| 6,057,055 A | 5/2000 | Kumagawa | 429/97 |

(Continued)

FOREIGN PATENT DOCUMENTS

JP        50655        7/1993

OTHER PUBLICATIONS

Photographs of Alps Keyfob Terminals (figs 1-5), no date.

*Primary Examiner*—John S. Maples
(74) *Attorney, Agent, or Firm*—Foley & Lardner LLP (57) ABSTRACT

A button-type battery unit comprising an upper housing, a battery coupled to the upper housing, a printed circuit board and a lower housing. A positive battery terminal and a negative battery terminal are reflow soldered to the printed circuit board. The upper housing is coupled to the lower housing to enclose printed circuit board. The positive battery terminal and the negative battery terminal are positioned on the printed circuit board such that the upper housing moves along a single axis of translational movement when being coupled to the lower housing.

4 Claims, 5 Drawing Sheets

U.S. PATENT DOCUMENTS

| | | |
|---|---|---|
| 6,087,037 A | 7/2000 | Rieder .......................... 429/99 |
| 6,117,588 A | 9/2000 | Campbell et al. ........... 429/187 |
| 6,136,467 A | 10/2000 | Phelps, III et al. ........... 429/97 |
| 6,218,041 B1 * | 4/2001 | Barbier et al. ................ 429/96 |
| 6,361,359 B1 * | 3/2002 | Du et al. .................... 439/500 |

* cited by examiner

METHODOLOGY FOR MAKING ELECTRICAL CONTACT FROM A BUTTON CELL BATTERY TO A PRINTED CIRCUIT BOARD AND A PROCESS FOR MANUFACTURING THE SAME

TECHNICAL FIELD

This invention relates generally to battery units using a button cell battery to power an electronic circuit. More particularly, this invention relates to a design of button battery contacts to facilitate low cost of material and low cost of assembly, using an automated assembly process.

BACKGROUND OF THE INVENTION

Battery units are commonly used for a variety of purposes. For example, battery units are often used in portable electronic devices such as remote control devices for automobiles, allowing a user to lock or unlock car doors and perform a variety of other functions without using a key. Such devices have become increasingly popular in recent years, and there has arisen the need for an improved process of manufacturing battery units in an efficient and inexpensive manner while achieving a high degree of reliability. More particularly, there has arisen the need to decrease the cost of manufacturing and increase the quality of such devices through the use of automated processes.

Since the size of portable electronic devices is continuously decreasing, the space requirement of the battery unit is of particular importance. The smaller the battery unit, the more compact the portable electronic device can be.

Figure 14:
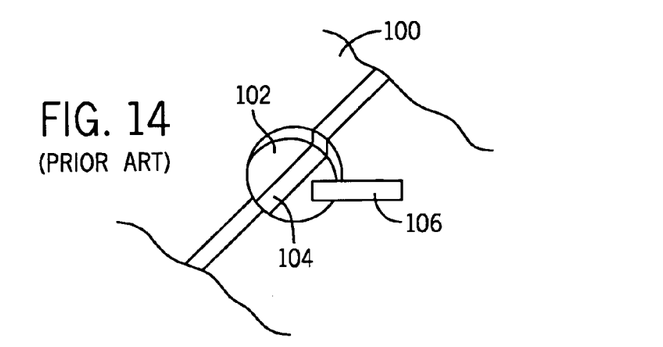
FIG. 14 is an isometric view of another prior art arrangement of the positive and negative battery terminals.

There are currently a number of types of battery units and methods for manufacturing the same, but each type of unit and method of manufacture has certain drawbacks. For example, one type of prior art battery unit, shown in prior art FIG. 14 and Japanese Publication No. P2000-149898A, reveals a circuit board 100 having a cylindrical-shaped indentation 102 for the placement of a battery. A first electrode 104 runs across the bottom of the indentation 102, while a second electrode 106 extends from the circuit board 100 over the top of the indentation 102. In this arrangement, however, the battery must be slid underneath the second electrode 106. This step can be difficult to accomplish with an automated system, resulting in an increased amount of assembly time and cost of automated equipment. Furthermore, in the event that the orientation of the battery is inadvertently reversed, the resulting reverse bias can cause damage to the circuit inside the unit. The likelihood of such a reverse bias occurring is also increased when a person, rather than an automated system, must place the battery into the unit or when an individual replaces a dead battery.

Figure 15:
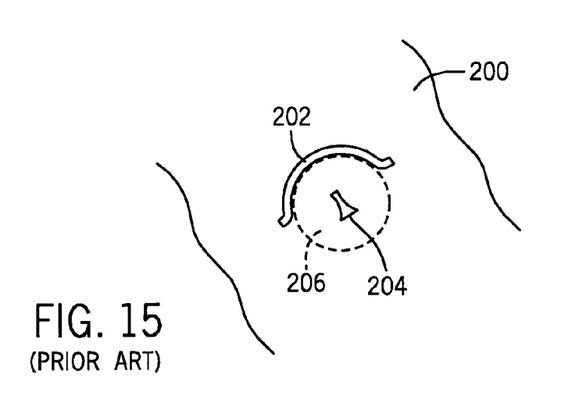
FIG. 15 is an elevational view of another prior art arrangement of the positive battery terminal.

In a second prior art arrangement, as shown in FIG. 15 and Japanese Publication No. H5-50655, a battery sits flat in a region 206 on the surface of the circuit board 200. A first contact 202 is positioned to wrap partially around the battery, forming a vertical wall that is no higher than the battery is thick. This wall is anchored at both ends by parts of the wall that lie flat on the circuit board 200. A second contact 204 lies flat on the circuit board 200, touching the underside of the battery. Under this arrangement, however, it is possible for the battery to slide out of position before the case is completely assembled. Additionally, the vertical wall that is used to make up a portion of the first contact 202 can be easily damaged by a mispositioned battery during assembly.

Another type of portable battery unit is currently produced by Alps Automotive and includes a printed circuit board with a plurality of through holes formed therein. Positive and negative battery terminals are placed on the circuit board to correspond with these through holes, and the positive and negative battery terminals are hand-soldered to the printed circuit board. Although the end product is relatively robust in design, the process for placing and soldering the positive and negative battery terminals to the printed circuit board may be manually intensive and time consuming. If the placing and soldering were automated, it would be more difficult and more expensive. In particular, the placement and soldering of the terminals would be a separate operation after placing and soldering the electronic components. Also, the positive terminal has a footprint of approximately twice the area of this design.

SUMMARY OF THE INVENTION

A method for manufacturing a portable battery unit includes automatically placing battery contacts onto a PCB using a pick and place machine that is standard to PCB assembly and that is also being used to place the electronic components on the PCB. The positive and negative battery terminals are presented to the pick and place machine in tape and reel form or are bowl fed to the pick and place machine. The battery terminals are placed with the same equipment and during the same process that is used to place the electrical components on the PCB, reducing overall assembly costs. Using standard PCB assembly equipment, such as a pick and place machine, typically can take less than one second per terminal. The screen printing, solder paste, and oven reflow do not add to the assembly time because these steps are performed at the same time that the electrical components are placed on the PCB.

A pick and place machine is then used to pick and place the lower housing onto a fixture or pallet. A PCB assembly having positive and negative battery terminals is placed into the lower housing. A battery is placed onto the same fixture or pallet. The upper housing is snap fit over the battery. The upper housing assembly is then snap fit onto the lower housing assembly, completing the assembly of the electronic device and battery unit.

These and other objects, advantages, and features of the invention, together with its organization and the manner of its operation, are apparent in the following detailed description and in the drawings.

DETAILED DESCRIPTION OF THE INVENTION

Figure 1:
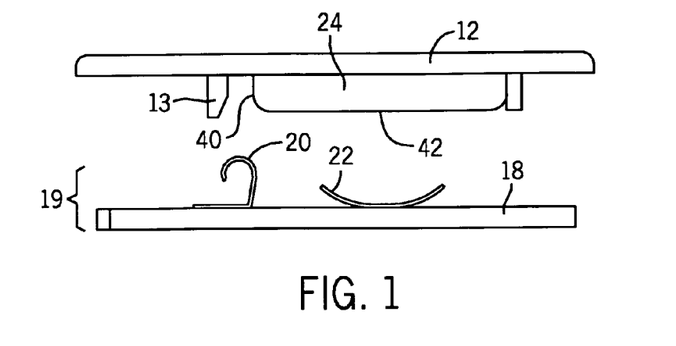
FIG. 1 is a side view of the printed circuit board with the battery terminals and the upper housing with the battery prior to mating the parts together, according to one embodiment of the invention.
Figure 2:
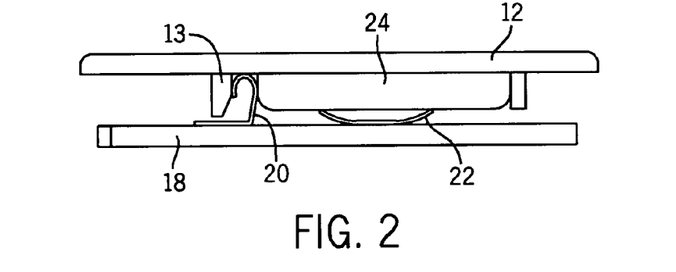
FIG. 2 is a side view of the printed circuit board, the battery terminals, and the upper housing after mating the parts together according to one embodiment of the invention.
Figure 3:
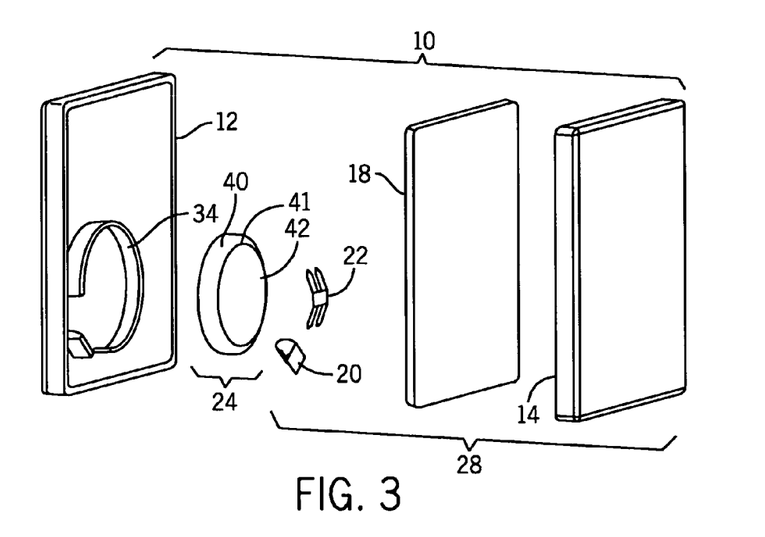
FIG. 3 is an isometric exploded view showing the individual battery unit components before the assembly process begins.

As shown in FIGS. 1–3 and 5, a battery unit, shown generally at 10 (FIG. 3), includes an upper housing 12 and a lower housing 14. A printed circuit board 18 includes a positive battery terminal 20 and a negative battery terminal 22 which, along with the other circuit board components (not shown), form a printed circuit board assembly 19 (FIG. 1). The positive battery terminal 20 and the negative battery terminal 22 both contact a battery 24, with the positive battery terminal 20 contacting a positive end 40 of the battery 24 and the negative battery terminal 22 contacting a negative end 42 of the battery, supplying power to the battery unit 10. As can be seen more clearly in FIG. 3, the battery 24 includes an annular insulator 41 adjacent to the periphery of the battery 24. The insulator 41 operates to separate the negative end 42 of the battery 24, located on the bottom portion of the battery 24 and held in contact with the negative battery terminal 22, from the positive end 40 of the battery 24 located on the top and sides of the battery as shown in FIG. 3.

According to one embodiment of the invention, the positive battery terminal 20 and the negative battery terminal 22 have particular dimensional ratios such that they can be supplied in taped pockets on a reel otherwise known as tape and reel and the negative battery terminal 22 is located in a pocket 38. The purpose of packaging the positive battery terminal 20 and the negative battery terminal 22 in tape and reel form is to present the positive battery terminal 20 and the negative battery terminal 22 to the pick and place machine in an efficient manner for ease of pick-up by the machine. As shown in FIGS. 10–13, the positive battery terminal 20 is located in a pocket 30 on the tape and reel. One of the difficulties encountered when packaging a component in tape and reel is the component must be sufficiently constrained to minimize movement and rotation. Also, the component must be prevented from flipping up on its side or upside down. It must be presented to the vacuum nozzle for pick up by the pick and place machine. During the pick up phase of the terminal, the nozzle of the pick and place machine moves to a preprogrammed position in the tape pocket. The terminal must be constrained enough so the terminal is in relatively the same location each time within the pocket, thereby allowing the vacuum nozzle to approach and attach to on approximately the same area on the terminal each time. A flat spot is required for vacuum pickup. Then the pick and place machine can place the component onto the solder pasted printed circuit board 18. For this reason, the geometry of the positive battery terminal 20, the negative battery terminal 22, and their respective ratios of the length, width and height are chosen to constrain the positive battery terminal 20 and the negative battery terminal 22 within the pocket of the tape and reel.

Figure 4:
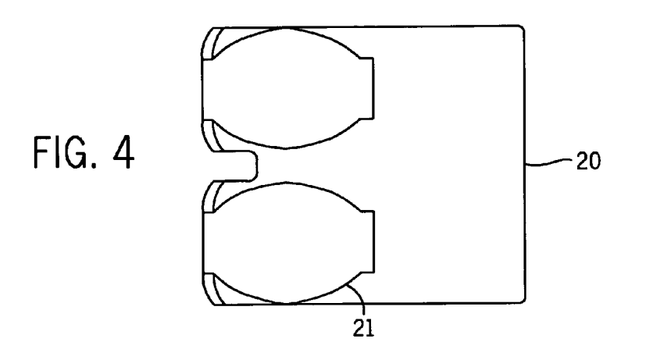
FIG. 4 is a top view of the positive battery terminal according to one embodiment of the invention.
Figure 7:
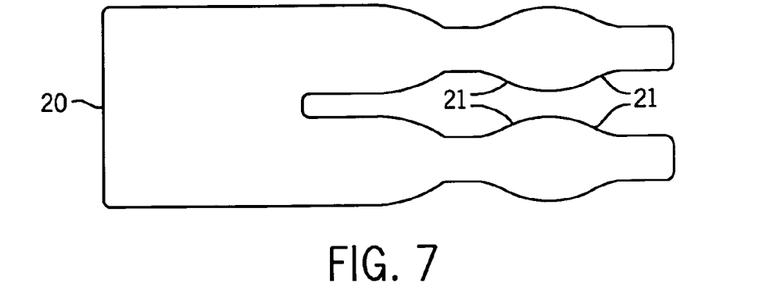
FIG. 7 is a top view of the positive battery terminal of FIG. 4 in a flat condition prior to forming.
Figure 8:
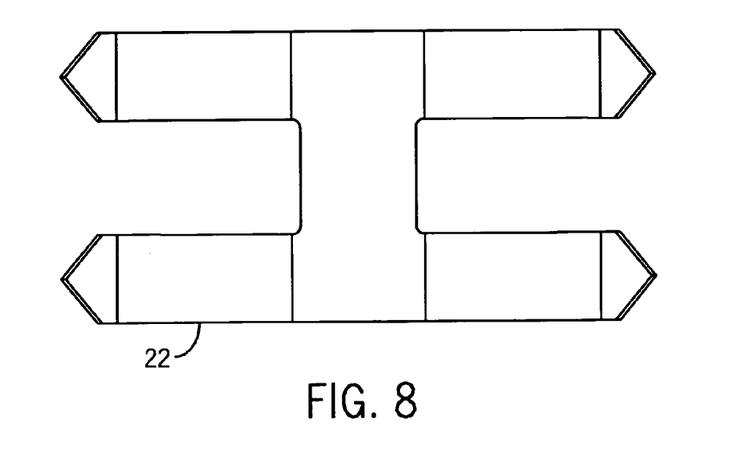
FIG. 8 is a top view of the negative battery terminal according to one embodiment of the invention.
Figure 9:
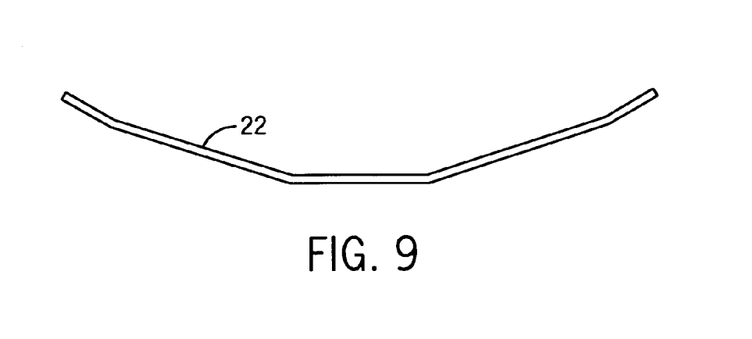
FIG. 9 is a side view of the negative battery terminal of FIG. 8.
Figure 10:
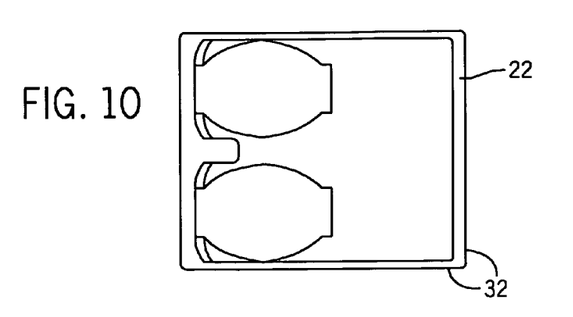
FIG. 10 is a top view of a positive battery terminal in the pocket of tape according to an alternate embodiment of the invention.
Figure 11:
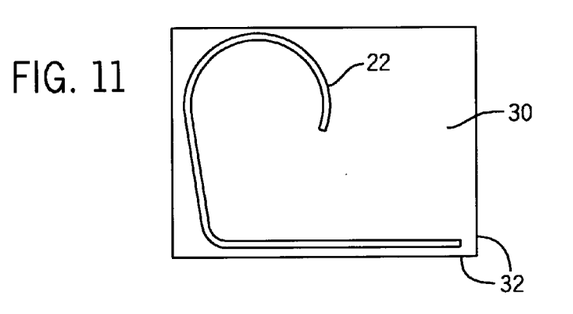
FIG. 11 is a side view of a positive battery terminal in the pocket of tape according to an alternate embodiment of the invention.
Figure 12:
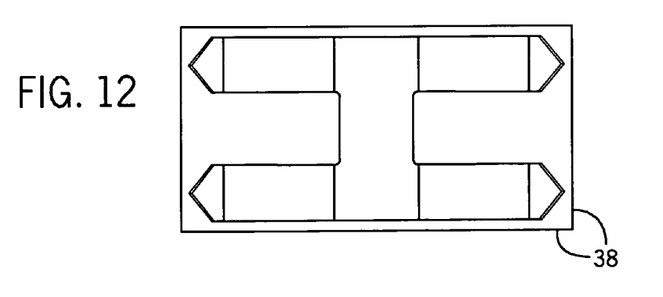
FIG. 12 is a top view of a negative battery terminal in the pocket of tape according to an alternate embodiment of the invention.
Figure 13:
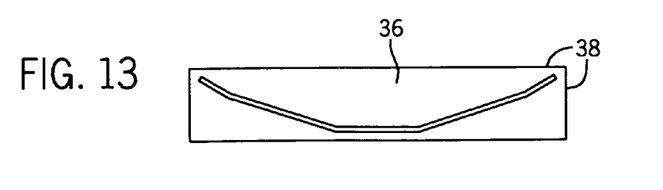
FIG. 13 is a side view of a negative battery terminal in the pocket of tape according to an alternate embodiment of the invention.
Figure 16:
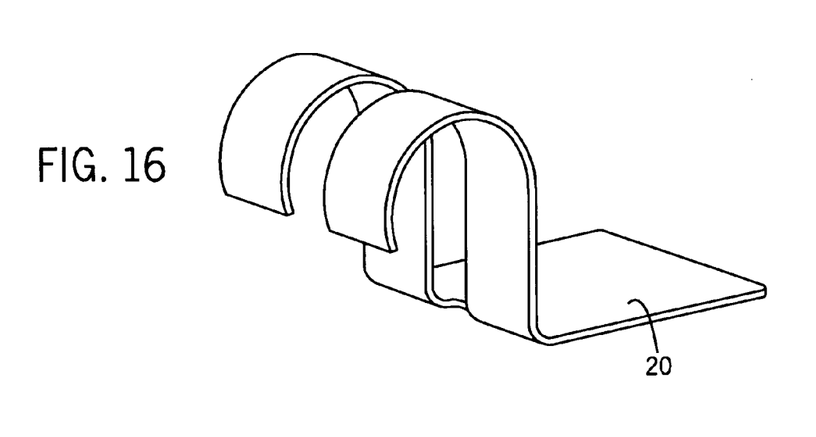
FIG. 16 is an isometric view of the positive battery terminal with a different geometry according to another embodiment of the invention.

The particular shapes of the positive battery terminal 20, according to one embodiment of the invention, is shown in FIGS. 4 and 7. The shape of the positive battery terminal 20 according to an alternate embodiment of the invention is shown in FIG. 16. The shape of the negative battery terminal 22, according to one embodiment of the invention, is shown in FIGS. 8 and 9. A variety of other shapes and dimensions for the positive battery terminal 20 and the negative battery terminal 22 are also possible.

The positive battery terminal 20 may be formed from a variety of materials such as phosphor bronze 510, spring steel, stainless steel or beryllium copper with tin plating. It is possible that other materials may be used depending upon the particular design, performance and cost requirements. It is also possible other platings may be used as long as the terminal is solderable.

Other methods of presenting the terminals to the pick and place machine, such as the use of bowl feeding, may be used instead of a tape and reel. Such alternative methods are well known to those in the art.

Like the positive battery terminal 20, the negative battery terminal 22 is supplied in a tape and reel assembly. This allows for a pick and place machine or other pick and place device to easily pick up the negative battery terminal 22 for simple placement into the solder paste. According to one embodiment of the invention, the negative battery terminal 22 is placed into the solder paste in such a location that the battery 24 will be subsequently placed directly on top of the negative battery terminal 22.

By having the positive battery terminal 20 and the negative battery terminal 22 packaged in standard tape and reel, they can be fed into a surface mount pick and place machine, minimizing assembly costs. According to one embodiment of the invention, a standard surface mount pick and place machine is used to place the positive battery terminal 20 and negative battery terminal 22 into the solder paste.

The positive battery terminal 20 and the negative battery terminal 22 preferably have a relatively large degree of elasticity. This elasticity allows the positive battery terminal 20 and the negative battery terminal 22 a sufficient degree of flex, permitting some misalignment of the individual components in the assembly of the battery unit. Such misalignment can result from tolerance build-up of the upper housing 12, the lower housing 14, the printed circuit board assembly 19, the positive battery terminal 20, the negative battery terminal 22, and the battery 24 during the manufacture of the individual pieces, as well as in the assembly of the battery unit. The elasticity of the positive battery terminal 20 and negative battery terminal 22 allow for sufficient contact pressure to maintain a reliable electrical connection between the battery 24 and the positive and negative battery terminals 20 and 22.

In recent years, it has become increasingly important for portable battery units to have a compact design. The compact design, however, limits the dimensions of the positive battery terminal 20 and negative battery terminal 22. In particular, the compact dimensions of the positive battery terminal 20 require sufficient elastic deformation of a section shown at 23 in FIG. 5. The ability of the positive battery terminal 20 to elastically deform a large distance without becoming permanently deformed is of particular importance to the performance of the positive battery terminal 20. The more the positive battery terminal 20 can elastically deform, the looser the tolerances can be on the mating parts of the remainder of the portable battery unit 10. These looser tolerances then contribute to lower component piece costs. Additionally, a large elastic deformation leads to a more reliable design because the contact pressure between the positive battery terminal 20, the negative battery terminal 22, and the battery 24 will vary less from one assembly to another, therefore ensuring constant and reliable electrical contact.

The majority of the flexibility of the positive battery terminal 20 and the negative battery terminal 22 are achieved in two ways. First, a material with the appropriate properties is chosen. The material properties of particular interest are the modulus of elasticity and the yield strength of the material. The flexibility is maximized when the YS/E ratio is maximized, where YS equals yield strength and E equals the modulus of elasticity.

Figure 5:
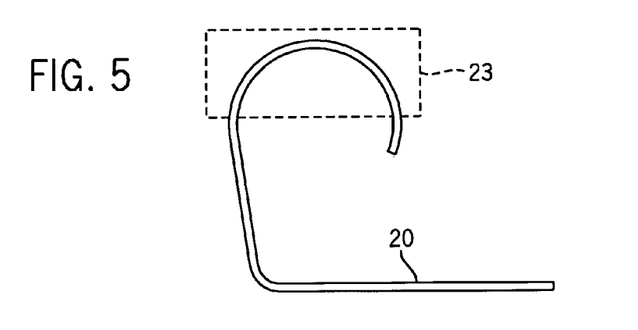
FIG. 5 is a side view of the positive battery terminal of FIG. 4.
Figure 6:
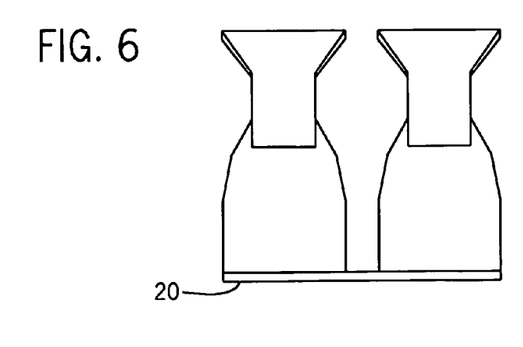
FIG. 6 is a front view of the positive battery terminal of FIG. 4.

A second method of achieving the maximum flexibility is related to the geometry. As shown in FIG. 5, the area designated at 23 is the area where the majority of the elastic deformation occurs. Maximum flexibility is achieved in the area 23 by varying the width along the positive battery terminal 20, as is shown in FIGS. 4–7. The width of the material varies in the area 23 to maintain a relatively constant bending stress in the material over this length. By maintaining a constant stress, with stress being directly proportional to strain, the deformation is also distributed over this larger length, thereby maximizing flexibility.

The housing wall 13 shown in FIGS. 1–2 serves a number of different purposes. The housing wall 13 serves to minimize tolerance stack-up in the assembly comprising the upper housing 12, the lower housing 14, the printed circuit board assembly 18, the positive battery terminal 20, the negative battery terminal 22, and the battery 24 during the manufacture of the individual pieces, as well as during the assembly process of the portable battery unit 10. With the housing wall 13 present, the tolerance stack-up primarily involves only the upper housing 12 and the battery 24.

The housing wall 13 also adds force between the positive battery terminal 20 and the battery 24, as is shown in FIG. 2. This force is required to establish sufficient contact pressure to maintain a reliable electrical contact. This added force allows for a design where a minimum of torque is translated to the base of positive terminal 20 where it joins the printed circuit board 18. The torque translates into a peel force between positive terminal 20 and printed circuit board 18. This peel force is minimized to ensure a reliable bond between the positive terminal 20 and the printed circuit board 18.

Furthermore, the above-described design and process allows for the automated assembly of the battery unit, virtually eliminating the possibility of misplacing the battery 24 and causing a reverse bias. Even if the battery 24 were assembled upside down during assembly by the manufacturer or during replacement of the battery 24 by the user, the design of the present invention does not allow a reverse bias condition which can damage the electronic circuitry. If the unit 10 were assembled by accident with the battery 24 upside down, the unit 10 receives no power, because the positive battery terminal 20 and the negative battery terminal 22 are contacting the same positive end 40 of the battery 24, which end 40 covers the top and sides of the battery 24.

The assembly of the printed circuit board assembly 19 is generally as follows: A pick and place machine sequentially picks the positive battery terminal 20 and the negative battery terminal 22 from taped pockets of the tape and reel and places them onto the printed circuit board 18. The positive battery terminal 20 and the negative battery terminal 22 are placed into solder paste (not shown) that has been screen or stencil-printed onto the printed circuit board 18 prior to placement of the terminals. In an embodiment of the invention, the positive battery terminal 20 and the negative battery terminal 22 are placed at the same time other electronic components (not shown) are placed on the printed circuit board 18. After all of the components (not shown) and the positive and negative battery terminals 20 and 22 are placed, the solder paste is reflowed in an oven, surface-mounting the positive battery terminal 20, the negative battery terminal 22, and the electronic components (not shown). Neither terminal requires through holes on the printed circuit board. Instead they are surface-mount which lends itself more to automation using standard surface-mount equipment. No manual soldering is required, and this significantly reduces the overall assembly cost.

The next step of the process involves the assembly of the printed circuit board assembly 19, the battery 24, the upper housing 12, and the lower housing 14. A second pick and place machine (or the same machine later on) places the battery 24 onto a fixture or pallet (not shown). The fixture or pallet preferably includes a battery centering feature and a cutout for the sides of the lower housing 14. The upper housing 12 may be placed over the battery 24, and the upper housing 12 and the battery 24 may then snap fit together. The pick and place machine places the lower housing 14 onto the pallet next to the upper housing 12, with the outside portion of the lower housing 14 facing downward. The printed circuit board assembly 19 is then placed into the lower housing 14. The upper housing 12 assembly with the battery 24 is then placed upon and snapped together with the lower housing assembly 14.

In one preferred embodiment of the invention, the use of the pick and place machine allows for simple top down or z-axis assembly of the terminals, battery, PCB, and housings. By requiring the pick and place machine to travel along only one axis of movement during assembly, the battery unit can be manufactured quickly and inexpensively using relatively inexpensive equipment.

Additionally, the above assembly process allows for a battery unit 10 that has an overall thickness not much greater than the thickness of the battery 24.

While preferred embodiments have been shown and described, it should be understood that changes and modifications can be made without departing from the invention in its broader aspects. For example, it is possible that a variety of pick and place devices or machines, such as chip shooters or fine pitch machines, can be used to place the individual components of the battery unit 10. The positive battery terminal 20 and the negative battery terminal 22 can also include a variety of dimensions, shapes, and configurations so long as they fall within the general aspects described here. As discussed earlier, a bowl feeder assembly or similar automated mechanism can also be used in place of a tape and reel assembly. Furthermore, the pick and place machine can move along multiple axes of translational motion when picking up individual components so long as the coupling action is still accomplished along a single axis of movement. Additionally, it is possible that only one or several pick and place machines could be used during the assembly process. A flexible membrane may also be coupled to the upper housing for waterproofing or other purposes, with carbon pills or pucks being used to the active PCB switches. Various features of the invention are defined in the following claims which form a part of this specification.

What is claimed is:

1. A method of assembling a battery unit, comprising the steps of:
   reflow soldering a positive battery terminal and a negative battery terminal onto a printed circuit board;
   coupling an upper housing to the battery;
   coupling the printed circuit board to a lower housing;
   coupling the lower housing to the upper housing such that the battery contacts the positive battery terminal and negative battery terminal, and
   positioning the positive battery terminal and the negative battery terminal on the printed circuit board prior to soldering such that after the second coupling step is carried out, the third coupling step can be carried out by moving the lower housing along a single axis of translational motion toward the upper housing, wherein the upper housing includes a housing wall, wherein the step of coupling the upper housing to the battery includes positioning an edge of the battery a spaced distance from the housing wall, wherein the step of positioning the positive battery terminal and the negative battery terminal prior to soldering includes positioning the positive battery terminal translationally on the circuit board such that, when the third coupling step is carried out, the positive battery terminal engages the housing wall and an edge of the battery on opposite surfaces.

2. The method of claim 1, wherein the second coupling step includes establishing a snap fit between the lower housing, the battery and the upper housing.

3. The method of claim 2, wherein a first pick and place device is used to locate the positive battery terminal and the negative battery terminal on the printed circuit board before reflow soldering.

4. The method of claim 3, wherein a second pick and place device is used to locate and couple the upper housing, the lower housing, the battery, and the printed circuit board.

* * * * *